(12) United States Patent
Bai et al.

(10) Patent No.: US 9,761,639 B2
(45) Date of Patent: Sep. 12, 2017

(54) ORGANIC LIGHT EMITTING DIODE ARRAY SUBSTRATE, AND DISPLAY DEVICE

(71) Applicants: Boe Technology Group Co., Ltd., Beijing (CN); Ordos Yuansheng Optoelectronics Co., Ltd., Inner Mongolia (CN)

(72) Inventors: Shanshan Bai, Beijing (CN); Fengli Ji, Beijing (CN); Minghua Xuan, Beijing (CN); Jiantao Liu, Beijing (CN); Jingbo Xu, Beijing (CN)

(73) Assignees: BOE TECHNOLOGY GROUP CO., LTD., Beijing (CN); ORDOS YUANSHENG OPTOELECTRONICS CO. LTD., Ordos, Inner Mongolia (CN)

( * ) Notice: Subject to any disclaimer, the term of this patent is extended or adjusted under 35 U.S.C. 154(b) by 114 days.

(21) Appl. No.: 14/775,836

(22) PCT Filed: Jan. 16, 2015

(86) PCT No.: PCT/CN2015/070888
§ 371 (c)(1),
(2) Date: Sep. 14, 2015

(87) PCT Pub. No.: WO2016/050014
PCT Pub. Date: Apr. 7, 2016

(65) Prior Publication Data
US 2016/0300892 A1    Oct. 13, 2016

(30) Foreign Application Priority Data

Sep. 30, 2014 (CN) .......................... 2014 1 0521023

(51) Int. Cl.
*H01L 27/32* (2006.01)
*G09G 3/20* (2006.01)
*G09G 3/3225* (2016.01)

(52) U.S. Cl.
CPC ....... *H01L 27/3218* (2013.01); *G09G 3/2003* (2013.01); *G09G 3/3225* (2013.01);
(Continued)

(58) Field of Classification Search
CPC .................................................. H01L 27/3218
See application file for complete search history.

(56) References Cited

U.S. PATENT DOCUMENTS

| 6,327,008 | B1 | 12/2001 | Fujiyoshi |
| 2007/0075627 | A1* | 4/2007 | Kimura ............... H01L 27/3213 313/503 |
| 2014/0077186 | A1 | 3/2014 | Kim |

FOREIGN PATENT DOCUMENTS

| CN | 102685407 | 9/2012 |
| CN | 103311266 | 9/2013 |

(Continued)

OTHER PUBLICATIONS

Translation of CN 104037201 B by Di. et al.*
(Continued)

*Primary Examiner* — Thao X Le
*Assistant Examiner* — Xia Cross
(74) *Attorney, Agent, or Firm* — Calfee, Halter & Griswold LLP

(57) ABSTRACT

The present invention provides an organic light emitting diode array substrate, and a display device, which belongs to the field of display technology, and can solve the problem that the sub-pixels of different colors in the existing organic light emitting diode array substrate have different life times. The organic light emitting diode array substrate of the
(Continued)

present invention comprises a plurality of sub-pixels having light emitting layers, the sub-pixels comprising first color sub-pixels, second color sub-pixels and third color sub-pixels with a number of the first color sub-pixels being the same as a number of second color sub-pixels and the same as a number of third color sub-pixels, and the first color sub-pixels are in a diamond shape; the second color sub-pixels and the third color sub-pixels are in a parallelogram shape, and lengths of their short sides are equal to a side length of the first color sub-pixels, lengths of their long sides are both greater than the side length of the first color sub-pixels.

6 Claims, 2 Drawing Sheets

(52) U.S. Cl.
  CPC .  *H01L 27/3216* (2013.01); *G09G 2300/0452* (2013.01); *G09G 2320/043* (2013.01)

(56) References Cited

FOREIGN PATENT DOCUMENTS

| CN | 103904105 | 7/2014 |
| CN | 103985735 | 8/2014 |
| CN | 103985738 | 8/2014 |
| CN | 104037201 | 9/2014 |
| CN | 104050889 | 9/2014 |

OTHER PUBLICATIONS

International Search Report and Written Opinion from PCT/CN15/70888 dated Jul. 6, 2015.
Office Action from China Application No. 201410521023.7 dated Dec. 15, 2016.
Office action from Chinese Application No. 201410521023.7 dated Sep. 19, 2016.

* cited by examiner

ORGANIC LIGHT EMITTING DIODE ARRAY SUBSTRATE, AND DISPLAY DEVICE

RELATED APPLICATIONS

The present application is the U.S. national phase entry of PCT/CN2015/070888, with an international filing date of Jan. 16, 2015, which claims the benefit of Chinese Patent Application No. 201410521023.7, filed on Sep. 30, 2014, the entire disclosures of which are incorporated herein by reference.

FIELD OF THE INVENTION

The present invention belongs to the field of display technology, particularly to an organic light emitting diode array substrate, and a display device.

BACKGROUND OF THE INVENTION

An array substrate of an organic light emitting diode (OLED) display device comprises a plurality of sub-pixels, each of the sub-pixels being provided with an organic light emitting diode for emitting light of a corresponding color, the organic light emitting diode comprises a cathode, an anode, a light emitting layer, and may also have a hole transport layer, a hole injection layer, an electron transport layer, an electron injection layer etc. Wherein, the materials of the light emitting layers of the sub-pixels of different colors are different, so their luminous efficiency and life time are also different. Generally speaking, the existing green light emitting layer has the highest efficiency and the longest life time, while the blue light emitting layer and the red light emitting layer have a relatively bad efficiency and life time (wherein the blue is generally the worst).

In the existing array substrate, the sub-pixels of respective colors are all rectangle of the same size; the array substrate in this form has a simple structure which is clear and neat, however, wherein the red sub-pixels and the blue sub-pixels (actually the light emitting layers therein) have relatively short life times, when their performances are degraded or damaged, the green sub-pixels are usually still in good condition, thereby rendering the whole life time of the array substrate to be relatively short, such that the performance of the green sub-pixels cannot be utilized sufficiently.

SUMMARY OF THE INVENTION

The technical problem to be solved by the present invention includes, with respect to the problem that the sub-pixels of different colors in the existing organic light emitting diode array substrate have different life times, providing an organic light emitting diode array substrate with balanced life times and high resolutions of various sub-pixels.

The technical solution adopted for solving the technical problem of the present invention is an organic light emitting diode array substrate, comprising a plurality of sub-pixels having light emitting layers, the sub-pixels comprising first color sub-pixels, second color sub-pixels and third color sub-pixels with a number of the first color sub-pixels being the same as a number of second color sub-pixels and the same as a number of third color sub-pixels, and
 the first color sub-pixels are in a diamond shape;
 the second color sub-pixels and the third color sub-pixels are in a parallelogram shape, and lengths of their short sides are equal to a side length of the first color sub-pixels, lengths of their long sides are both greater than the side length of the first color sub-pixels.

Preferably, each of the sub-pixels comprises one group of opposite sides parallel to a first direction and the other group of opposite sides parallel to a second direction.

Further preferably, the lengths of the long sides of the second color sub-pixels and the third color sub-pixels are both 1.5 times of the side length of the first color sub-pixels.

Further preferably, the array substrate comprises a plurality of repeating units, each of the repeating units comprising four first color sub-pixels, four second color sub-pixels and four third color sub-pixels Further preferably, in each of the repeating units, the long sides of two second color sub-pixels are parallel to the first direction, and the long sides of the other two second color sub-pixels are parallel to the second direction; the long sides of two third color sub-pixels are parallel to the first direction, and the long sides of the other two third color sub-pixels are parallel to the second direction.

Further preferably, in each of the repeating units, two first color sub-pixels are arranged adjacently along the first direction, the other two first color sub-pixels are arranged adjacently along the second direction; the two second color sub-pixels whose long sides are parallel to the first direction are arranged adjacently along the first direction, the two second color sub-pixels whose long sides are parallel to the second direction are arranged adjacently along the second direction; the two third color sub-pixels whose long sides are parallel to the first direction are arranged adjacently along the first direction, the two third color sub-pixels whose long sides are parallel to the second direction are arranged adjacently along the second direction.

Further preferably, in each of the repeating units, the two second color sub-pixels arranged adjacently along the first direction and the two first color sub-pixels arranged adjacently along the first direction are arranged in a first column; one end of the two second color sub-pixels arranged adjacently along the second direction coincides with a side of the first color sub-pixel at the end of the first column; a side of the two third color sub-pixels arranged adjacently along the second direction coincides with a side of the two second color sub-pixels arranged adjacently along the second direction; a side of the two third color sub-pixels arranged adjacently along the first direction coincides with a side of two second color sub-pixels in the first column, and one end of the two third color sub-pixels arranged adjacently along the first direction is in contact with a side of the other two third color sub-pixels; one end of the two first color sub-pixels arranged adjacently along the second direction coincides with one end of the two third color sub-pixels arranged adjacently along the second direction.

In this way, the respective sub-pixels are arranged compactly. That is to say, the respective sub-pixels are combined and arranged together in a seamless way, thereby filling in the display area of the whole array substrate.

Further preferably, the first color is green; one of the second color and the third color is red, the other is blue.

The technical solution adopted for solving the technical problem of the present invention is a display device comprising an organic light emitting diode array substrate stated above.

The sub-pixels of different colors in the organic light emitting diode array substrate of the present invention have different areas, the sub-pixel with a relatively short life time may have a relatively large area, the sub-pixel with a relatively long life time may have a relatively small area, according to the known rule, in the case of the same required display luminance (i.e., the luminance perceived by human eyes), the larger the area of the sub-pixel (actually the light emitting layer) is, the lower the luminance of a unit area will be, so the smaller the current density through the sub-pixel will be, its life time can be prolonged; therefore, the life times of sub-pixels of different colors can be balanced and the whole life time of the array substrate can be prolonged by adjusting the sizes of the sub-pixels of different colors; meanwhile, the luminous efficiencies of sub-pixels of different colors are different, the sensitivities of human eyes to different colors are also different, so in the array substrate, the areas of the sub-pixels can also be adjusted based on these factors, thereby achieving a better display effect; in addition, since the respective sub-pixels are arranged compactly and seamlessly, the organic light emitting diode array substrate has a relatively high resolution and a space utilization ratio, i.e., it can prolong the life time on the basis of increase of the resolution.

DETAILED DESCRIPTION OF THE INVENTION

Figure 1:
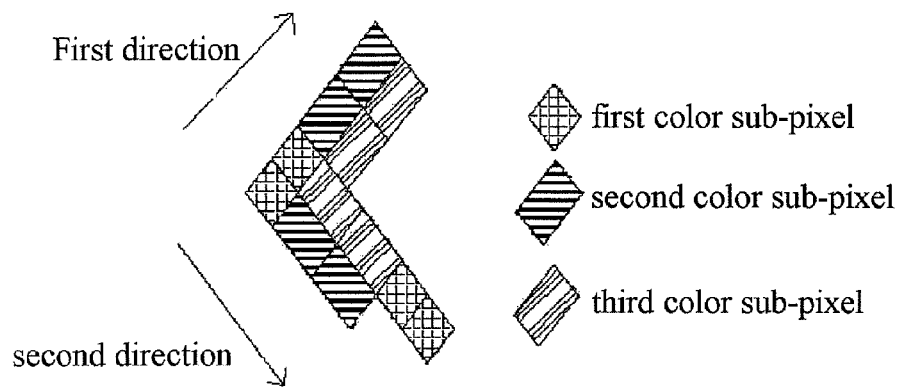
FIG. 1 is a schematic view of a structure of a repeating unit in an organic light emitting diode array substrate of an embodiment of the present invention.

In order to enable the skilled person in the art to understand the technical solution of the present invention better, next, the present invention will be described in more details with reference to the drawings and the specific embodiments.

Embodiment 1

This embodiment provides an organic light emitting diode array substrate, comprising a plurality of sub-pixels having light emitting layers, the sub-pixels comprising first color sub-pixels, second color sub-pixels and third color sub-pixels with a number of the first color sub-pixels being the same as a number of second color sub-pixels and the same as a number of third color sub-pixels, and the first color sub-pixels are in a diamond shape;

the second color sub-pixels and the third color sub-pixels are in a parallelogram shape, and lengths of their short sides are equal to a side length of the first color sub-pixels, lengths of their long sides are both greater than the side length of the first color sub-pixels.

Embodiment 2

This embodiment provides an organic light emitting diode array substrate, comprising a plurality of sub-pixels having light emitting layers, the sub-pixels comprising first color sub-pixels, second color sub-pixels and third color sub-pixels with a number of the first color sub-pixels being the same as a number of second color sub-pixels and the same as a number of third color sub-pixels.

That is to say, the organic light emitting diode array substrate of this embodiment is constituted by a plurality of sub-pixels, and these sub-pixels are arranged compactly, thereby filling in the display area of the whole array substrate seamlessly. Wherein, each sub-pixel comprises an organic light emitting diode, the organic light emitting diode is provided with a light emitting layer for emitting light. The sub-pixels in the array substrate are divided into three different colors (such as red, green, and blue), and the sub-pixels of each color have the number of sub-pixels as each other.

Of course, in the sub-pixel, except for the organic light emitting diode (in which a light emitting layer is provided), other structures such as a thin film transistor, a pixel definition layer (PDL, for separating the light emitting layers in different sub-pixels) are also provided, so the light emitting layer will not occupy the whole area of the sub-pixel, however, this does not influence the rule that the larger the area of the sub-pixel is, the larger the area of the light emitting layer is.

Wherein, the first color sub-pixels are in a diamond shape; the second color sub-pixels and the third color sub-pixels are in a parallelogram shape, and lengths of their short sides are equal to a side length of the first color sub-pixels, lengths of their long sides are both greater than the side length of the first color sub-pixels.

That is to say, in the array substrate, the sub-pixel of one color is in a diamond shape (with the equal side length), the sub-pixels of the other two colors are in a parallelogram shape (with unequal side lengths), and the length of the short side of the parallelogram is equal to the side length of the diamond, the length of the long side of the parallelogram is greater than the side length of the diamond.

The sub-pixels of different colors in the organic light emitting diode array substrate of the present invention have different areas, according to the known rule, in the case of the same required display luminance (i.e., the luminance perceived by human eyes), the larger the area of the sub-pixel (actually the light emitting layer) is, the lower the luminance of a unit area will be, so the smaller the current density through the sub-pixel will be, its life time can be prolonged. Therefore, the life times of sub-pixels of different colors can be balanced and the whole life time of the array substrate can be prolonged by adjusting the sizes of the sub-pixels of different colors; meanwhile, the luminous efficiencies of sub-pixels of different colors are different, the sensitivities of human eyes to different colors are also different, so in the array substrate, the areas of the sub-pixels can also be adjusted based on these factors, thereby achieving a better display effect; in addition, since the respective sub-pixels are arranged compactly and seamlessly, the organic light emitting diode array substrate has a relatively high resolution and a space utilization ratio, i.e., it can prolong the life time on the basis of increase of the resolution.

Preferably, the above first color is green, and one of the second color and the third color is red, the other is blue.

That is to say, preferably, the area of the green sub-pixel is relatively small, while the areas of the sub-pixels of the other two colors are relatively large. Because with respect to the performance of the existing light emitting layer material, in the case of the same area of the sub-pixels, generally the life time of the green sub-pixels is the longest (meanwhile efficiency is the highest, and the human eyes are also most sensitive to green), while the life times of the blue and red sub-pixels are relatively short, so the areas of the blue sub-pixels and the red sub-pixels can be enlarged to prolong their life times. Specifically, the commonly used doped-type green light material includes C-545T, C-545MT DMQA, DPT etc., the doped-type red light material includes DCJT, DCJTB, Tubrene etc., the undoped-type red light material includes ACEN, (PPA)(PPA)Pe etc., the blue light material includes TBADN, BCZVBi, DPVBI, DSA, TPP etc.

Of course, the above contents are not definitions to the protection scope of the present invention, i.e., the first color can also be red or blue, or the colors of the respective sub-pixels are other colors than red, green, blue.

Preferably, each of the sub-pixels comprises one group of opposite sides parallel to a first direction and the other group of opposite sides parallel to a second direction.

That is to say, the corresponding sides of the respective parallelograms and diamonds are preferably parallel with one another, thus it is convenient for compact arrangement of the sub-pixels.

More preferably, the lengths of the long sides of the second color sub-pixels and the third color sub-pixels are both 1.5 times of the side length of the first color sub-pixels.

That is to say, the sizes of the parallelograms of the second color sub-pixels and the third color sub-pixels are preferably equal, and the area thereof is 1.5 times of the first color sub-pixel. Such a multiple relationship on the one hand facilitates compact arrangement; on the other hand, for the existing light emitting layer material, enabling the area of the blue and the red sub-pixels to be 1.5 times of the area of the green sub-pixels can achieve both a better effect of prolonging the life time and a better display effect.

More preferably, the array substrate comprises a plurality of repeating units, each of the repeating units comprising four first color sub-pixels, four second color sub-pixels and four third color sub-pixels.

Figure 2:
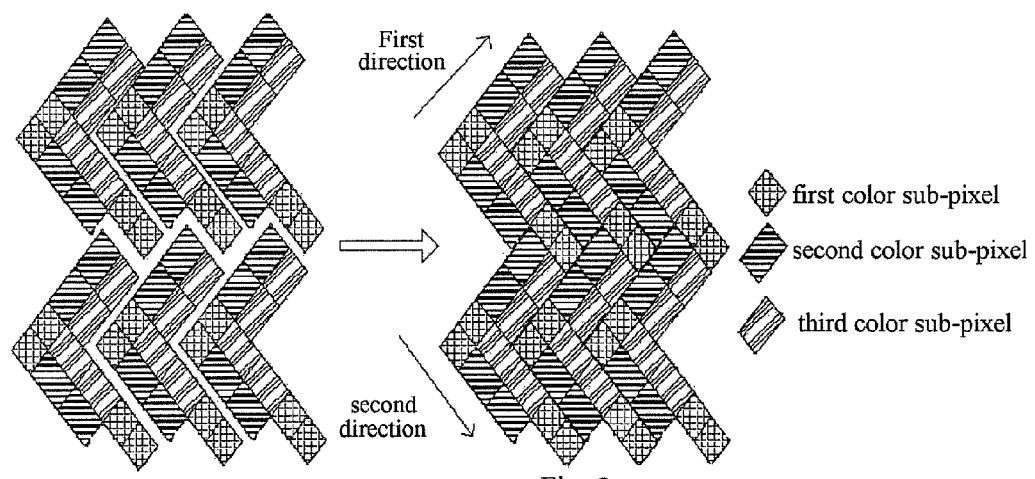
FIG. 2 is a schematic view of an organic light emitting diode array substrate of an embodiment of the present invention constituted by the repeating unit in FIG. 1.
Figure 4:
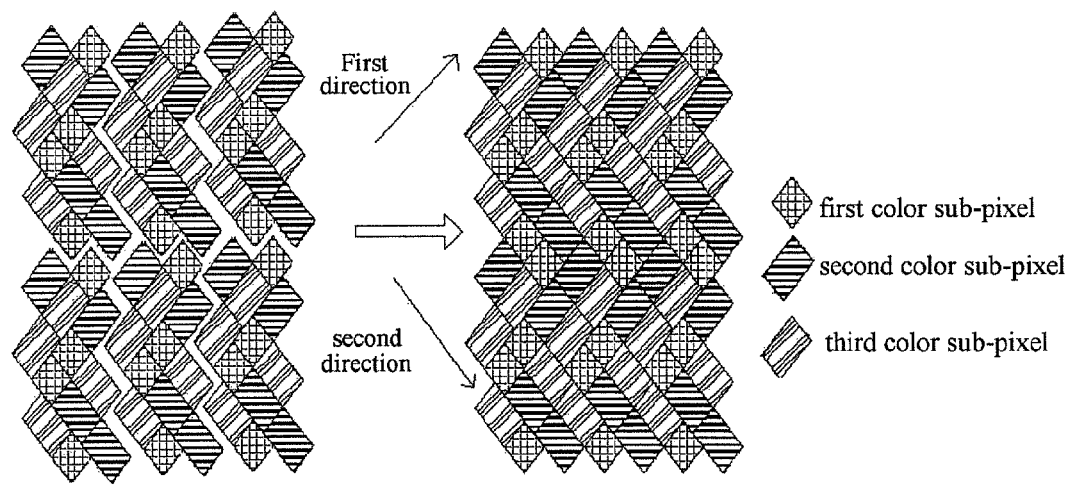
FIG. 4 is a schematic view of an organic light emitting diode array substrate of an embodiment of the present invention constituted by the repeating unit in FIG. 3.

That is to say, as shown in FIG. 2 and FIG. 4, the array substrate can also be regarded as being formed by arrangement of a plurality of same repeating units, wherein each repeating unit has the same structure, and comprises twelve sub-pixels arranged in a certain form. The advantage of such a form lies in that the arrangement of the sub-pixels in the whole array substrate is relatively regular, so it is relatively convenient for fabricating and driving.

Figure 3:
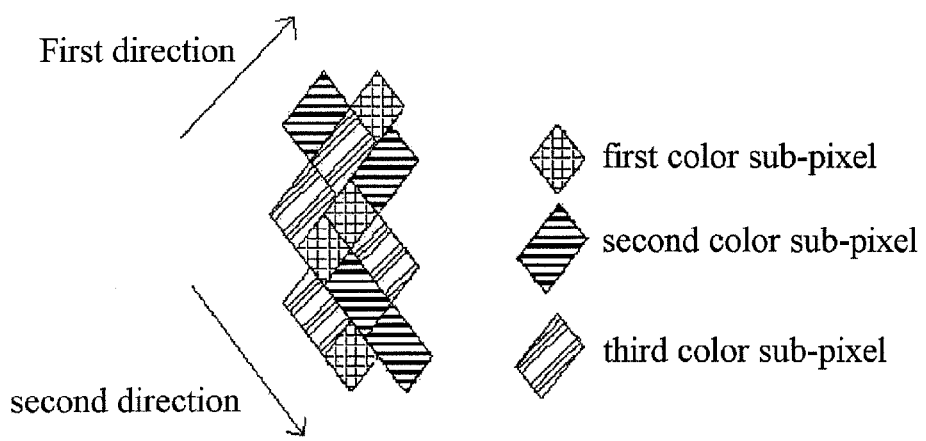
FIG. 3 is a schematic view of structure of another representing form of a repeating unit in an organic light emitting diode array substrate of an embodiment of the present invention.

More preferably, as shown in FIG. 1 and FIG. 3, in each of the repeating units, the long sides of two second color sub-pixels are parallel to the first direction, and the long sides of the other two second color sub-pixels are parallel to the second direction; the long sides of two third color sub-pixels are parallel to the first direction, and the long sides of the other two third color sub-pixels are parallel to the second direction.

That is to say, in the four second color sub-pixels of the repeating unit, the long sides of two are parallel to the first direction (the short sides thereof are parallel to the second direction correspondingly), the long sides of the other two are parallel to the second direction (the short sides thereof are parallel to the first direction correspondingly); the rule of the four third color sub-pixels is similar as this.

When the above arrangement condition is met, it is easy to realize compact arrangement of the respective sub-pixels in the case of relatively uniform distribution.

More preferably, the arrangement manner of the twelve sub-pixels in the repeating unit can be in the form as shown in FIG. 1.

The repeating unit in such a form can constitute an array substrate according to the manner as shown in FIG. 2, in the array substrate, the respective sub-pixels are arranged compactly, and the sub-pixels of different colors are distributed uniformly, it is easy to realize display of a high resolution, and the display effect is relatively good, the driving manner is relatively simple.

In addition, the above arrangement manner has a further advantage, i.e., wherein many sub-pixels of the same color are arranged adjacently, in this way, when the light emitting layers are formed through evaporation, the light emitting layers in such adjacent sub-pixels of the same color can be formed through an opening in a fine metal mask (FMM) plate. For the fine metal mask plate, the minimum size of its opening is limited (mainly limited by the process conditions), such that the minimum size of the light emitting layer formed by using it is limited, this also becomes an important factor of limiting reduction of the size of the sub-pixel (or limiting increase of the resolution). However, according to the above solution, since one opening in the fine metal mask plate can form light emitting layers in a plurality of sub-pixels simultaneously, the size of each sub-pixel can be reduced correspondingly (because it only corresponds to a part of the opening) in the case that the size of the opening is invariable, thereby increasing the resolution.

Of course, although the light emitting layers in part of the above sub-pixels can be manufactured through an opening in the mask plate, the driving electrodes of the organic light emitting diodes in respective sub-pixels are still separated, and each sub-pixel is also provided with a pixel definition layer, so each sub-pixel can still display the required contents independently.

More specifically, in the above repeating units, two first color sub-pixels are arranged adjacently along the first direction, the other two first color sub-pixels are arranged adjacently along the second direction; the two second color sub-pixels whose long sides are parallel to the first direction are arranged adjacently along the first direction, the two second color sub-pixels whose long sides are parallel to the second direction are arranged adjacently along the second direction; the two third color sub-pixels whose long sides are parallel to the first direction are arranged adjacently along the first direction, the two third color sub-pixels whose long sides are parallel to the second direction are arranged adjacently along the second direction.

That is to say, the sub-pixels of the same color in the repeating unit are divided into "two pairs", each "pair" contains two continuously arranged sub-pixels, then these "pairs" of sub-pixels constitute the repeating unit. Such a design facilitates increase of the number of the adjacent sub-pixels of the same color, so as to manufacture more light emitting layers in a plurality of sub-pixels using one opening in the mask plate.

Further preferably, as shown in FIG. 1, in the above repeating unit, the two second color sub-pixels arranged adjacently along the first direction and the two first color sub-pixels arranged adjacently along the first direction are arranged in a first column (the four sub-pixels in the upper left side of the figure); one end of the two second color sub-pixels (the two sub-pixels in the lower left side of the figure) arranged adjacently along the second direction coincides with a side of the first color sub-pixel at the end of the first column; a side of the two third color sub-pixels (the two third color sub-pixels in the lower part of the figure) arranged adjacently along the second direction coincides with a side of the two second color sub-pixels arranged adjacently along the second direction; a side of the two third color sub-pixels (the two third color sub-pixels in the upper part of the figure) arranged adjacently along the first direction coincides with a side of two second color sub-pixels in the first column, and one end of the two third color sub-pixels arranged adjacently along the first direction is in contact with a side of the other two third color sub-pixels; one end of the two first color sub-pixels (the two sub-pixels in the lower right corner of the figure) arranged adjacently along the second direction coincides with one end of the two third color sub-pixels arranged adjacently along the second direction.

That is to say, the respective sub-pixels are preferably arranged in the form as shown in FIG. 1 according to the above depiction, such a form can achieve a better effect in the aspects of increasing the resolution, improving the display effect and prolonging the life time of the array substrate, which is the optimal solution of the present invention.

Of course, it should be understood that the arrangement manner described above only represents the relative positional relationship among the respective sub-pixels in the repeating unit, rather than the absolute position, so its equivalent variation is also the protection scope of the present invention. For example, if the repeating unit is overturned horizontally or vertically (correspondingly the first direction and the second direction are also overturned), the obtained arrangement is essentially the same as the above arrangement. Or, if a different part in the array substrate is chosen as the repeating unit, as long as the arrangement manner of the sub-pixels in the whole array substrate is unchanged, the repeating unit is still the same essentially; for example, the repeating unit in FIG. 3 seems different from that in FIG. 1, however, from FIG. 4 it can be seen that the arrangement manner of the sub-pixels in the array substrate constituted by it (except for individual sub-pixels at the edge indeed) is actually the same as the arrangement manner of the sub-pixels of the array substrate in FIG. 2, therefore, the two are essentially the same repeating unit.

Wherein, the driving method (display method) of the array substrate of this embodiment is various, for example, each three adjacent sub-pixels of different colors therein can be taken as one "pixel", and the luminance of the three sub-pixels can be calculated based on the contents that need to be displayed by this pixel; or, the array substrate can be divided into a plurality of zones, the display contents and the like of each sub-pixel can be calculated based on the area proportion of the sub-pixels of different colors in each zone; anyway, the driving method thereof will be not described in detail here.

Embodiment 3

This embodiment provides a display device comprising an array substrate of any of the above. The display device is an organic light emitting diode (OLED) display device, which may specifically be any product or component with the display function such as electronic paper, a mobile phone, a panel computer, a television, a display, a laptop, a digital photo frame, a navigator.

It could be understood that the above embodiments are only exemplary embodiments used for explaining the principle of the present invention, however, the present invention is not limited to this. For the ordinary skilled person in the art, various modifications and improvements can be made without departing from the spirit and the essence of the present invention, these modifications and improvements are also regarded as the protection scopes of the present invention.

What is claimed is:

1. An organic light emitting diode array substrate, comprising a plurality of sub-pixels having light emitting layers, the sub-pixels comprising first color sub-pixels, second color sub-pixels and third color sub-pixels, wherein a number of the first color sub-pixels is the same as a number of the second color sub-pixels and the same as a number of the third color sub-pixels, wherein the first color sub-pixels are in a diamond shape;

the second color sub-pixels and the third color sub-pixels are in a parallelogram shape, and lengths of short sides of the second color sub-pixels and the third color sub-pixels are equal to a side length of the first color sub-pixels, lengths of long sides of the second color sub-pixels and the third color sub-pixels are both greater than the side length of the first color sub-pixels, wherein each of the sub-pixels comprises one group of opposite sides parallel to a first direction and another group of opposite sides parallel to a second direction, wherein the lengths of the long sides of the second color sub-pixels and the third color sub-pixels are both 1.5 times of the side length of the first color sub-pixels, wherein the array substrate comprises a plurality of repeating units, each of the repeating units comprising four first color sub-pixels, four second color sub-pixels and four third color sub-pixels, wherein in each of the repeating units, the long sides of two second color sub-pixels are parallel to the first direction, and the long sides of the other two second color sub-pixels are parallel to the second direction;

the long sides of two third color sub-pixels are parallel to the first direction, and the long sides of the other two third color sub-pixels are parallel to the second direction, and wherein in each of the repeating units, two first color sub-pixels are arranged adjacently along the first direction, the other two first color sub-pixels are arranged adjacently along the second direction;

the two second color sub-pixels whose long sides are parallel to the first direction are arranged adjacently along the first direction, the two second color sub-pixels whose long sides are parallel to the second direction are arranged adjacently along the second direction;

the two third color sub-pixels whose long sides are parallel to the first direction are arranged adjacently along the first direction, the two third color sub-pixels whose long sides are parallel to the second direction are arranged adjacently along the second direction.

2. The organic light emitting diode array substrate according to claim 1, wherein, in each of the repeating units, the two second color sub-pixels arranged adjacently along the first direction and the two first color sub-pixels arranged adjacently along the first direction are arranged in a first column;

one end of the two second color sub-pixels arranged adjacently along the second direction coincides with a side of the first color sub-pixel at the end of the first column;

a side of the two third color sub-pixels arranged adjacently along the second direction coincides with a side of the two second color sub-pixels arranged adjacently along the second direction;

a side of the two third color sub-pixels arranged adjacently along the first direction coincides with a side of two second color sub-pixels in the first column, and one end of the two third color sub-pixels arranged adjacently along the first direction is in contact with a side of the other two third color sub-pixels;

one end of the two first color sub-pixels arranged adjacently along the second direction coincides with one end of the two third color sub-pixels arranged adjacently along the second direction.

3. The organic light emitting diode array substrate according to claim 1, wherein the first color is green;

one of the second color and the third color is red, the other is blue.

4. A display device comprising the organic light emitting diode array substrate according to claim 1.

5. The display device according to claim 4, wherein, in each of the repeating units, the two second color sub-pixels arranged adjacently along the first direction and the two first color sub-pixels arranged adjacently along the first direction are arranged in a first column;

one end of the two second color sub-pixels arranged adjacently along the second direction coincides with a side of the first color sub-pixel at the end of the first column;

a side of the two third color sub-pixels arranged adjacently along the second direction coincides with a side of the two second color sub-pixels arranged adjacently along the second direction;

a side of the two third color sub-pixels arranged adjacently along the first direction coincides with a side of two second color sub-pixels in the first column, and one end of the two third color sub-pixels arranged adjacently along the first direction is in contact with a side of the other two third color sub-pixels;

one end of the two first color sub-pixels arranged adjacently along the second direction coincides with one end of the two third color sub-pixels arranged adjacently along the second direction.

6. The display device according to claim 4, wherein the first color is green; one of the second color and the third color is red, the other is blue.

* * * * *